United States Patent [19]

Uezono et al.

[11] Patent Number: 6,081,999
[45] Date of Patent: Jul. 4, 2000

[54] WIRE-CIRCUIT SHEET MANUFACTURING METHOD

[75] Inventors: Kouichi Uezono; Keiichi Ozaki, both of Kosai; Sanae Kato; Akira Sugiyama, both of Gotenba, all of Japan

[73] Assignee: Yazaki Corporation, Tokyo, Japan

[21] Appl. No.: 09/210,579

[22] Filed: Dec. 14, 1998

Related U.S. Application Data

[62] Division of application No. 08/377,231, Jan. 24, 1995.

[30] Foreign Application Priority Data

| Jan. 25, 1994 | [JP] | Japan | 6-006215 |
| Feb. 10, 1994 | [JP] | Japan | 6-016804 |
| Apr. 28, 1994 | [JP] | Japan | 6-091729 |

[51] Int. Cl.$^7$ ........................................ H01K 3/10
[52] U.S. Cl. .......................... 29/850; 29/739; 29/755; 29/825; 29/564.2; 29/566.2
[58] Field of Search ................ 29/825, 755, 739, 29/850, 584.2, 566.2; 439/404; 140/92.1

[56] References Cited

U.S. PATENT DOCUMENTS

| 3,079,672 | 3/1963 | Bain, Jr. et al. | 29/850 |
| 3,329,916 | 7/1967 | Love | 174/117 |
| 3,535,780 | 10/1970 | Berger | 29/837 |
| 4,387,509 | 6/1983 | Dechelette | 29/850 |
| 4,646,436 | 3/1987 | Crowell et al. | 29/850 |
| 4,859,806 | 8/1989 | Smith | 174/261 |
| 5,156,557 | 10/1992 | Okafuji et al. | 439/404 |
| 5,289,633 | 3/1994 | Okafuji et al. | 29/850 |
| 5,345,978 | 9/1994 | Okafuji et al. | 140/92.1 |

FOREIGN PATENT DOCUMENTS

| 2014959B2 | 11/1970 | Germany . | |
| 211396 | 9/1971 | Germany . | |
| 2657419A1 | 7/1977 | Germany . | |
| 2821992A1 | of 1978 | Germany . | |
| 57-53083 | 3/1982 | Japan . | |
| 64-9411 | 1/1989 | Japan . | |
| 4-172908 | 6/1992 | Japan . | |
| 4-363876 | 12/1992 | Japan . | |
| 5-121139 | 5/1993 | Japan . | |
| 7-212939 | 8/1995 | Japan . | |
| 7-298453 | 11/1995 | Japan . | |
| 7-302975 | 11/1995 | Japan . | |
| 7-320549 | 12/1995 | Japan . | |
| 608280 | 4/1978 | U.S.S.R. | 29/850 |
| 756679 | 8/1980 | U.S.S.R. | 29/850 |
| 869084 | 10/1981 | U.S.S.R. | 29/850 |
| 1615216 | 9/1969 | United Kingdom . | |

OTHER PUBLICATIONS

Electronics Dec. 20, 1979, pp. 117–121, article by G. Messner et al.

*Primary Examiner*—Carl J. Arbes
*Attorney, Agent, or Firm*—Arent Fox Kintner Plotkin & Kahn, PLLC

[57] ABSTRACT

A wire-circuit sheet includes; a resin sheet with circuit connecting holes, wires lying across the circuit connecting holes, and at least one cutting hole to punch the resin sheet so as to cut simultaneously the wires. Further, a wire-circuit sheet and its manufacturing method include; a resin sheet on which a plurality of wires lie as crossing or coming close to each other, cutting of holes being provided at the crossing or close points of the plurality of wires to cut off the wires and the sheet together, and the wires being fixed and sandwiched in between laminated resin sheets with a sticky surface. Moreover, in an electric junction box utilizing the wire-circuit sheet, a busbar-wire connecting method includes the steps of: forming insertion holes through a cover in order to insert and fix busbar-tabs as terminals; inserting the busbar-tabs as terminals into the insertion holes in the cover; mounting a wire-circuit sheet at a predetermined position on the cover; And using the busbar-tabs as welding electrodes to weld the wires and the busbar-tabs together to connect them in a conductive state.

4 Claims, 18 Drawing Sheets

WIRE-CIRCUIT SHEET MANUFACTURING METHOD

This application is a divisional application filed under 37 C.F.R §1.53(b) of parent application Ser. No. 08/377,231 filed Jan. 24, 1995.

BACKGROUND OF THE INVENTION (1) Field of the Invention

The present invention relates to a wire-circuit sheet and an electric junction box in which a plurality of the wire-circuit sheets are laminated to form a high density circuit for a compact electric junction box.

(2) Description of the Prior Art

FIG. 23 shows a wire-circuit board of a conventional electric junction box disclosed in Japanese Utility Model Preliminary Publication No. 64-9411.

This wire-circuit board assembly 30 is composed of a busbar-circuit board 31 and a wire-circuit board 32. The busbar-circuit board 31 has a plurality of busbars 34 laid on an insulating resin substrate 33. Busbar terminal tabs 35 pierce the substrate 33 so as to extend downward from a rear surface thereof. The wire-circuit board 32 has a plurality of conductive wires 36, each end of which is connected by soldering with each terminal piece 38 on an insulating substrate 37 so that each female terminal 39 associated with each terminal piece 38 can make contact with each of the busbar terminal tabs 35.

However, the structure of the above mentioned conventional electric junction box has a drawback that an electric junction box will become bulky if the wire-circuit board assemblies 30 are multiply stacked to provide an electric junction box having a high density circuit. Further, it requires a great deal of labor cost to connect the conductive wires 36 by solder brazing to the wire-circuit board 32, which causes a low productivity rate. Moreover, residual wire chips may be undesirably scattered in the electric junction box.

SUMMARY OF THE INVENTION

This invention has focused attention on the above drawback and aims to provides a wire-circuit sheet being produced in an improved productivity and an electric junction box which is not bulky even when a plurality of the wire-circuit sheets are laminated therein to make a high density circuit.

(1) To achieve the above mentioned objects, a wire-circuit sheet comprises: a resin sheet with a circuit connecting hole; a wire lying across the circuit connecting hole; and a cutting hole to punch the resin sheet so as to cut simultaneously the wire. The wires are preferably sandwiched in between a couple of the resin sheets.

Further, an electric junction box of this invention comprises; one or a plurality of resin sheets each of which has a circuit connecting hole; a wire lying across the circuit connecting hole; and a cutting hole to punch each of the resin sheets so as to cut simultaneously the wire; an intermediate insulating board inserted between the resin sheet to make the resin sheet folded to be laminated; a circuit board having a connecting portion with the resin sheet; and a case receiving the circuit board therein. The circuit board preferably has a protruding connection portion, wherein a through opening is provided on an outer wiring resin sheet to communicate the connecting portion with an inner wiring resin sheet.

Referring to the operation of the above mentioned invention, the wires on the wire-circuit sheet are exposed as crossing over the circuit connecting holes to make contact with the circuit board or another wire-circuit sheet thereby. The wires are reliably positioned and secured between the couple of the resin sheets. A plurality of circuits are completed by the cutting holes to cut the wires. The intermediate insulating board inserted between the resin sheet to make the resin sheet folded to be laminated. The outer wiring sheet lying on the intermediate insulating board makes contact directly with the circuit board, while the inner wiring sheet makes contact with the connection portions of the circuit board by the through openings.

(2) To achieve the above mentioned objects, a busbar-wire connecting method in regard to an electric junction box comprises the steps of: forming a predetermined number of circuit connecting holes through an insulating sheet; laying a predetermined number of wires on the insulating sheet in such a way as to cross the circuit connecting holes to form a wire-circuit sheet; forming insertion holes through a cover in order to insert and fix busbar-tabs as terminals; inserting busbar-tabs as terminals into insertion holes in the cover; mounting the wire-circuit sheet at a predetermined position on the cover; and using the busbar-tabs as welding electrodes to weld the wires and the busbar-tabs together to connect them in a conductive state.

Referring to the operation of the invention set forth above it the wire-circuit sheet is fabricated in a separate assembly line by laying wires between the insulating sheets in such a manner as to cross the circuit connecting holes piercing through the insulating sheets. Then, in the main assembly line, the terminal busbar-tabs are inserted into the insertion holes in the cover and the wire-circuit sheet is aligningly positioned on the cover. The busbar-tabs are used as welding electrodes to weld together the wires and the busbar-tabs in a conductive state. The wire laying process therefore can be separated from the main assembly line. In the main assembly line the busbar-tabs can be positioned and held by the cover when they are being connected to the wires. As a result, the wire-busbar connecting work becomes easy and the time required for the connection is shortened. Because of this connection method, cut wire chips are not scattered on the main assembly line, improving the productivity of the main assembly line.

A busbar-wire connecting apparatus in regard to an electric junction box, comprises: a wire-circuit sheet including an insulating sheet, a predetermined number of circuit connecting holes piercing through the insulating sheet, and a predetermined number of wires laid on the insulating sheet in such a way as to cross the circuit connecting holes; a cover having insertion holes formed therein; busbar-tabs as terminals inserted into the insertion holes in the cover; a jig having welding electrodes connected to the busbar-tabs, the jig being adapted to hold the cover; and a welding electrode disposed on the wire-circuit sheet side.

Referring to the operation of the apparatus set forth above when the wires crossing the circuit connecting holes in the wire-circuit sheet are to be connected conductively to the busbar-tabs inserted into the insertion holes in the cover, the back of the cover is supported near the busbar-tabs by the jig so that the cover can resist the pressing force of the welding electrode. Then, the welding electrode is pressed against the wires crossing the circuit connecting holes and is applied electricity to weld the wires and busbar-tabs together. In the main assembly line, this connecting method can reduce the time of and the efficiency of the wire-busbar connecting work.

A busbar-wire connecting apparatus in regard to an electric junction box comprises: a wire-circuit sheet including an insulating sheet, a predetermined number of circuit connecting holes piercing through the insulating sheet and a predetermined number of wires laid on the insulating sheet in such a way as to cross the circuit connecting holes; a cover having insertion holes formed therein; busbar-tabs as terminals inserted into the insertion holes in the cover; a busbar-tab positioning board which is provided separately from the cover and has busbar-tab fixing holes for inserting to fix the busbar-tabs and welding holes, these holes piercing through the substrate; and, wherein after the busbar-tabs are fixed in the busbar-tab fixing holes, the busbar-tabs and the wires are welded together in a conductive state.

Referring to the operation of the invention set forth above, in a separate assembly line, wires are laid between the insulating sheets in such a way that the wires cross the circuit connecting holes in the insulating sheets, thus forming the wire-circuit sheet. Then, the vertical portions of the terminal busbar-tabs are inserted into the busbar-tab fixing holes in the busbar-tab positioning board. The wire-circuit sheet is aligningly positioned on the busbar-tab positioning board. After this, in the main assembly line, the wire-circuit sheet together with the busbar-tab positioning board is mounted on the cover to insert the vertical portions of the busbar-tabs into the insertion holes in the cover. At the same time, the wires crossing the circuit connecting holes in the wire-circuit sheet are conductively welded to the busbar-tabs fixed in the cover through the welding holes formed in the busbar-tab positioning board. With this connecting method, because the wire laying process can be separated from the main assembly line, the wire-busbar connecting time in the main assembly line can be reduced. Further, because residual wire chips are not scattered in the main assembly line, the productivity of the main line can be improved.

A busbar-wire connecting method set forth in regard to an electric junction comprises the steps of; forming a predetermined number of circuit connecting holes through an insulating sheet; laying a predetermined number of wires on the insulating sheet in such a way as to cross the circuit connecting holes to form a wire-circuit sheet; forming insertion holes through a cover for inserting and fixing of busbar-tabs as terminals; using a busbar-tab positioning board provided separately from the cover to fix the busbar-tabs, the busbar-tab positioning board having busbar-tab fixing holes and welding holes, these holes piercing through the board; positioning the wire-circuit sheet with respect to the busbar-tab positioning board; welding together the busbar-tabs and the wires by using the welding holes; and stacking the busbar-tab positioning board on the cover in such a way that the busbar-tabs are inserted into the insertion holes in the cover.

Referring to the operation of the invention set forth above, in the separate assembly line, wires are laid on the insulating sheet in such a way as to cross the circuit connecting holes in the insulating sheet to form the wire-circuit sheet. Then, the vertical portions of the terminal busbar-tabs are inserted into the busbar-tab fixing holes in the busbar-tab positioning board so that they are firmly positioned and fixed. The wire-circuit sheet is aligningly stacked on the busbar-tab positioning board, The wires crossing the circuit connecting holes in the wire-circuit sheet are conductively welded through the welding holes to the busbar-tabs fixed in the busbar-tab positioning board. Then, in the main assembly line, the wire-circuit sheet together with the busbar-tab positioning board is mounted on the cover to insert the vertical portions of the busbar-tabs into the insertion holes in the cover. With this connecting method, the wire laying process can be separated from the main assembly line. Further, the connection between the wires and the busbar-tabs can be performed in the separate assembly line with the busbar-tabs firmly positioned by the busbar-tab positioning board. The connection work therefore can be done easily, Further, because residual wire chips are not scattered in the main assembly line, the productivity of the main assembly line can be improved.

A busbar-wire connecting method in regard to an electric junction box comprises the steps of: forming protrusions on the cover that fit into the welding holes in the busbar-tab positioning board; and filling the welding holes by the protrusions when the busbar-tab positioning and welding board is stacked on the cover.

Referring to the operation of the invention set forth above, because the cover is provided with protrusions that fit into the welding holes in the busbar-tab positioning board, when the busbar-tab positioning board is stacked on the cover, the welding holes are filled by the protrusions. This prevents water from collecting in and seeping through the welding holes in the busbar-tab positioning board, so that the connected busbar-tabs and wires can be protected.

(3) To achieve the above mentioned objects, a wire-circuit sheet of this invention comprises: a resin sheet on which a plurality of wires lie as crossing or coming close to each other; cutting holes provided at the crossing or close points of the plurality of wires to cut the wires and the sheet together; and the wires being fixed and sandwiched in between the laminated resin sheets with a sticky surface.

And, a manufacturing method for a wire-circuit sheet of this invention comprises the steps of: a plurality of wiring pins are slidably inserted in holes formed on a wire-laying base plate; the plurality of pins are projected on the wire-laying base plate and are resiliently supported by springs; wires are laid between the pins by a wire positioning feeder; an upper adhesive resin sheet is provided and pressed to the wires laid on the base plate to bond thereto; a lower resin sheet is provided and pressed to the upper resin sheet with the bonded wires; thus wires are bonded to be fixed between the upper and lower resin sheets; and cutting holes are provided at crossing or close points of the plurality of wires to cut the wires and the sheet together. Positioning holes are preferably formed in the upper and lower resin sheets with wires being fixed therebetween. The resin sheet can be fed from a rolled sheet or can be handled as piece substrates by a carrier with a suction cap.

The upper resin sheet is pressed to the wire-laying base plate, which makes the pins retract, and the wires are bonded to the upper resin sheet. Then, the lower resin sheet is bonded to the upper resin sheet with the wires therebetween so that the wires can stick to both of the upper and lower sheets to be fixed without any deviation. Further, the positioning holes in the resin sheets are advantageous for correctly positioning the wire-circuit sheet in an electric junction box or the like. Moreover, cutting holes piercing through the resin sheet are provided at crossing or close points of the plurality of wires so as to cut off the wires to make a plurality of separate circuits.

DETAILED DESCRIPTION OF PREFERRED EMBODIMENT

Figure 1:
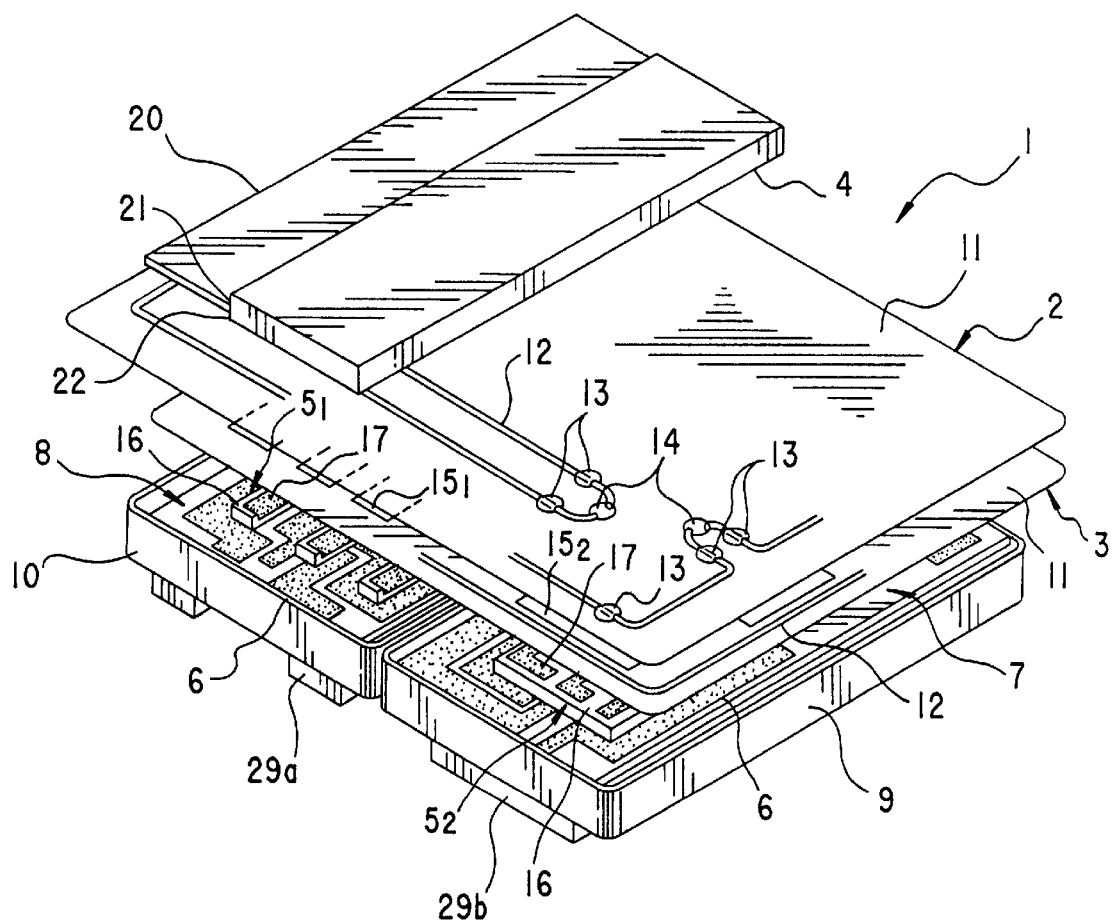
FIG. 1 is an exploded perspective view showing an embodiment of an electric junction box utilizing wire-circuit sheets according to this invention.
Figure 2:
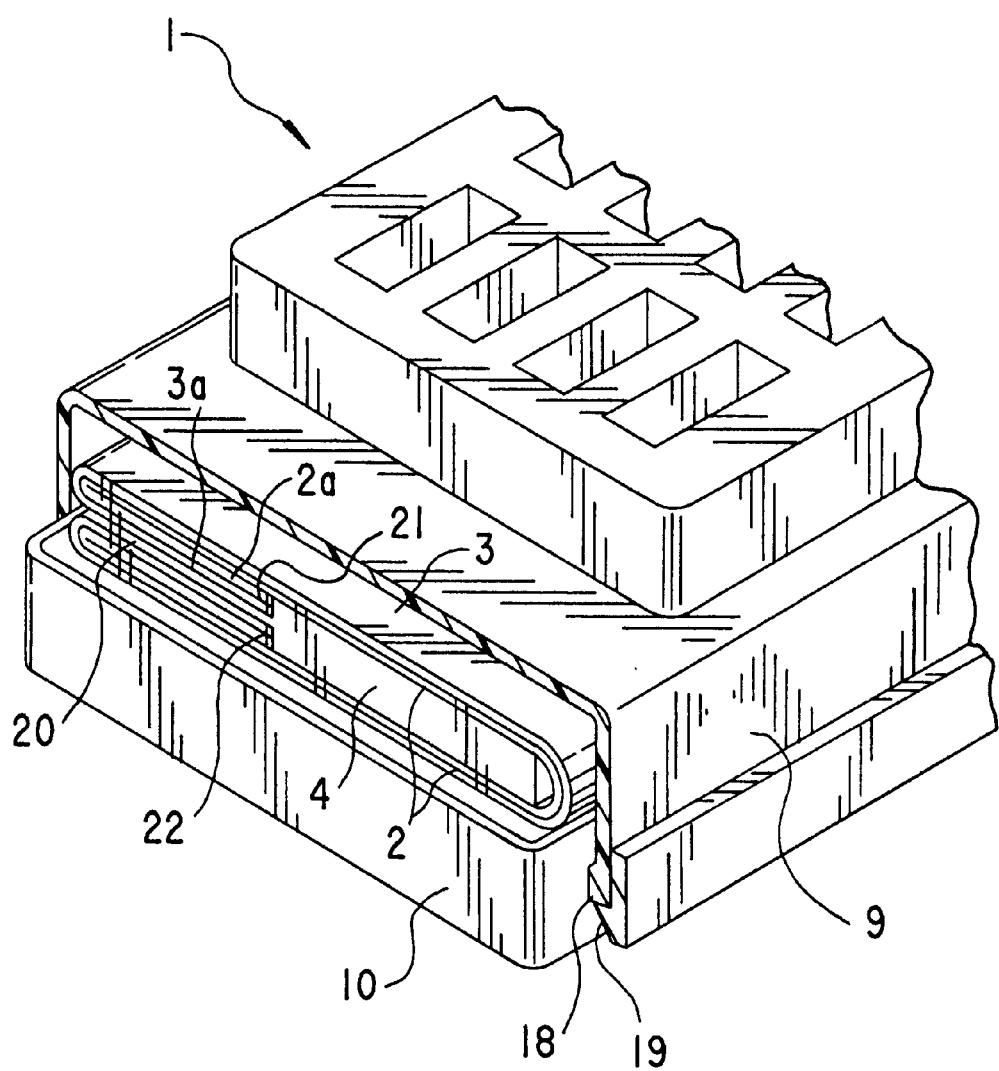
FIG. 2 is a perspective view, partially broken away, showing a part of the embodiment in FIG. 1.

FIGS. 1 and 2 show an embodiment of an electric junction box utilizing wire-circuit sheets in regard to this invention.

The electric junction box 1 comprises: a couple of wire-circuit sheets 2 and 3; an intermediate insulating board 4 inserted between the couple of wire-circuit sheets 2,3 to make the wire-circuit sheets folded at the middle portion thereof and laminated; busbar-circuit boards 7,8 having connection portions $5_1, 5_2$, 6 corresponding to the wire-circuit sheets 2,3; and, an upper and lower cover 9,10 receiving the busbar-circuit boards 7,8.

The wire-circuit sheets 2,3 have conductive open-wires 12 laid on flexible resin sheets 11. Through connection holes 13 formed in advance on the resin sheets, the wires 12 are connected to the wires 12 on the other resin sheet or the connection portions $5_1, 5_2$ 6 of the busbar-circuit boards 7,8. Further, predetermined portions of the wires have been cut by cutting holes 14 in regard to each sheet 11 respectively. The number of wire-circuit sheets is not limited to two and may be one or more than two. The busbar-circuit boards 7,8 may be altered to print circuit boards or any other circuit boards.

In FIG. 1, the wire-circuit sheet 3 opposing to the busbar-circuit boards 7,8 has the through openings $15_1, 15_2$ corresponding to the connection portions $5_1, 5_2$ of the bus bar-circuit boards 7,8, so that the wire-circuit sheet 2 opposing to the insulating board 4 can make contact directly with the connection portions $5_1, 5_2$. The connection portions $5_1, 5_2$ are composed of terminal ends 17 of projecting bars 18 on the surface of the busbar-circuit boards 7, 8 received in the covers 9,10.

The connection portions 6 of lower busbars of the circuit boards 7,8 connect with the wire-circuit sheet 3. The terminal ends 17 of the projecting bars 16 connect with the wire-circuit sheet 2. The wires 12 on each of wire-circuit sheets 2,3 connect with the wires 12 on each other sheet through the circuit connecting holes 13. Coated wires may be utilized in stead of open-wire 12, wherein wires can lie across each other on the resin sheet 11, but the wires positioned at the circuit connecting holes 13 are required to have stripped the insulating coat off.

The couple of wire-circuit sheets 2,3, as shown in FIG. 2, are folded at the middle portion thereof and laminated with an intermediate insulating board 4 inserted into them. The couple of folded wire-circuit sheets 2,3 are received between the upper and lower covers 9,10. The upper cover 9 combines with lower cover 10 by engaging a locking claw 19 thereof with a protrusion 18 formed on the lower cover 10. The couple of upper and lower covers may be combined to be opened and closed by a hinge connection (not shown). One end of the intermediate insulating board 4 is formed as a thickness-reduced plate 20 so that an end part 2a,3a can be further folded to be laminated. As a result, the couple of wire-circuit sheets 2,3 can be positioned in the both stepped space 21,22 opposing to the thickness-reduced plate 20.

Figure 3:
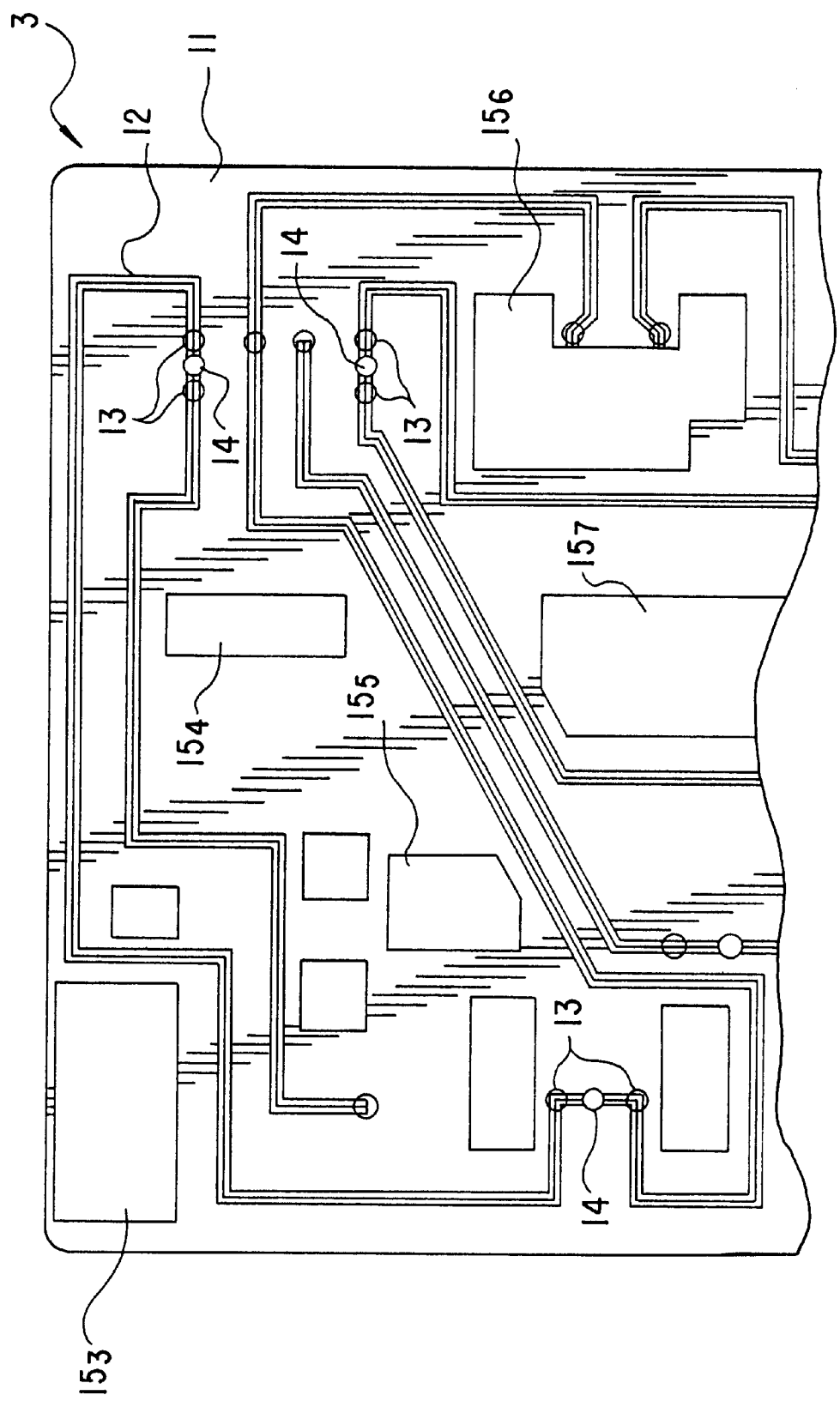
FIG. 3 is a top view showing an outer wire-circuit sheet according to this invention.
Figure 4:
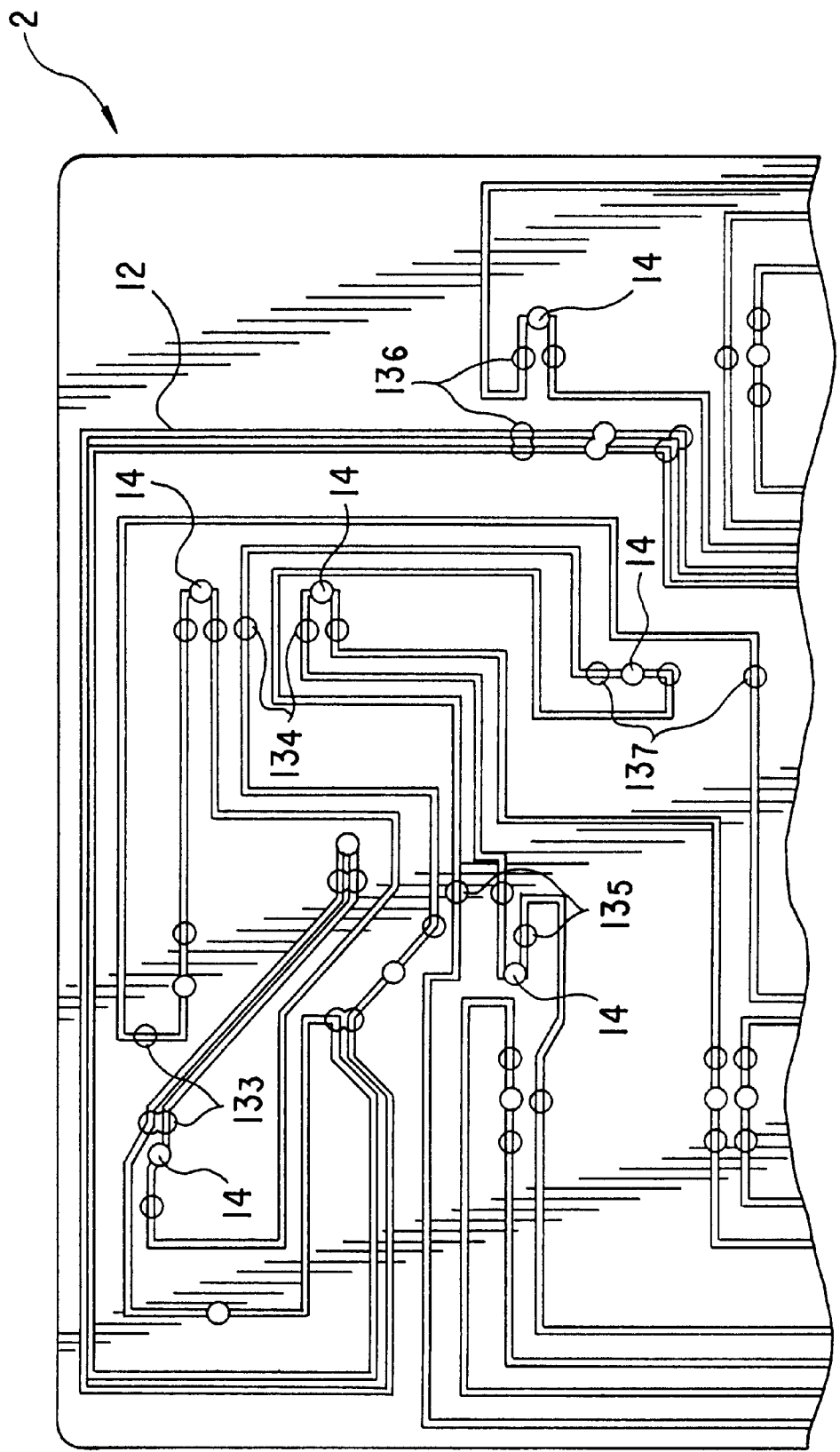
FIG. 4 is a top view showing an inner wire-circuit sheet according to this invention.

FIGS. 3,4 shows an example of the outer wire-circuit sheet 3 and the inner wire-circuit sheet 2 respectively. The resin sheet 11 of the outer wire-circuit sheet has a plurality of through holes 15 and, corresponding to the through holes $15_3$ to $15_7$, circuit connecting holes $13_3$ to $13_7$ are provided and positioned in the inner wire-circuit sheet 2. At each of the circuit connecting holes 13, conductive open-wires 12 are positioned, while cutting holes 14 are appropriately arranged to make separate circuits.

Figure 5A:
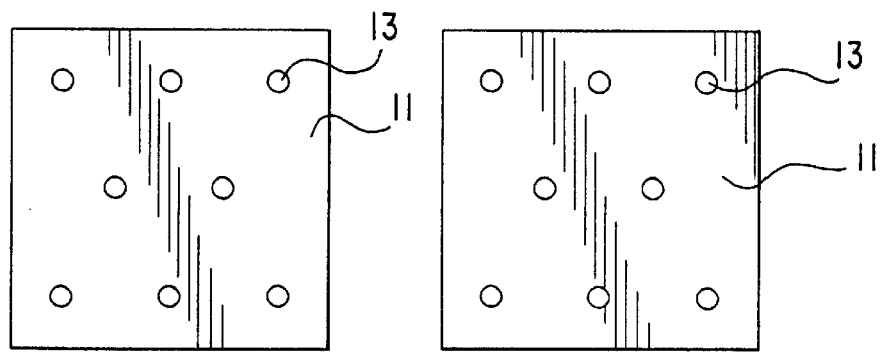
FIGS. 5A to 5C are top views showing manufacturing processes of wire-circuit sheets according to this invention.
Figure 5B:
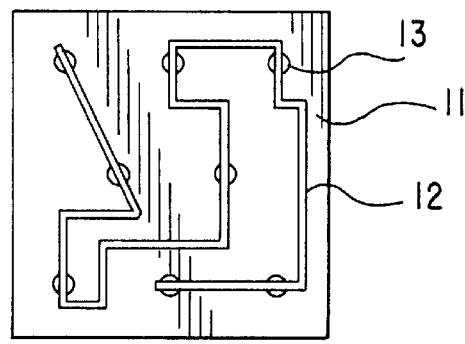
Figure 5C:
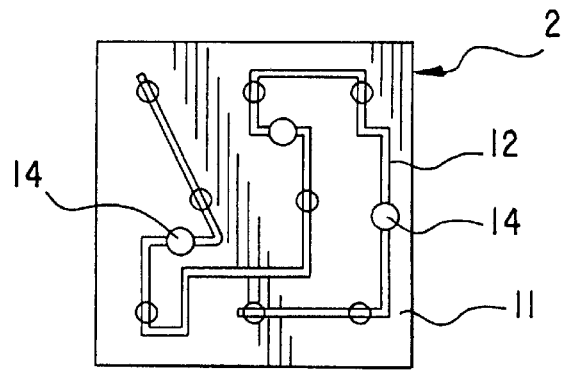

FIGS. 5A, 5B and 5C show manufacturing processes for the wire-circuit sheet 2. One wire-circuit sheet 2 comprises, as shown in FIG. 5A, a couple of insulating resin sheets 11/11 being the same in size. Each of the resin sheets 11 has circuit connecting holes 13 arranged in advance at the same positions as each other. One of the resin sheets 11, as shown in FIG. 5B, is bonded to the other resin sheet 11 after the conductive wire 12 is laid on the one of the resin sheets 11. The wire 12 is laid across the circuit connecting holes 13.

The wire 12 is initially laid on a pin board for wiring by a wire handling arm head (not shown) and then shifted to the resin sheet 11 so as to be laid thereon. The resin sheet 11 is made of saturated polyester resin or the like. On the surface of the resin sheet 11, a thermoplastic adhesive (a hot-melt adhesive or the like) is coated. The wire 12 is bonded and fixed on the resin sheet 11 by a hot-press. Finally, as shown in FIG. 5C, the cutting holes 14 are formed at predetermined positions to cut the wire 12 for every sheet 11 and to complete each wire-circuit sheet 2. The wire-circuit sheet 2 is produced in a process differed from an assembling line of the electric junction box 1.

Figure 6:
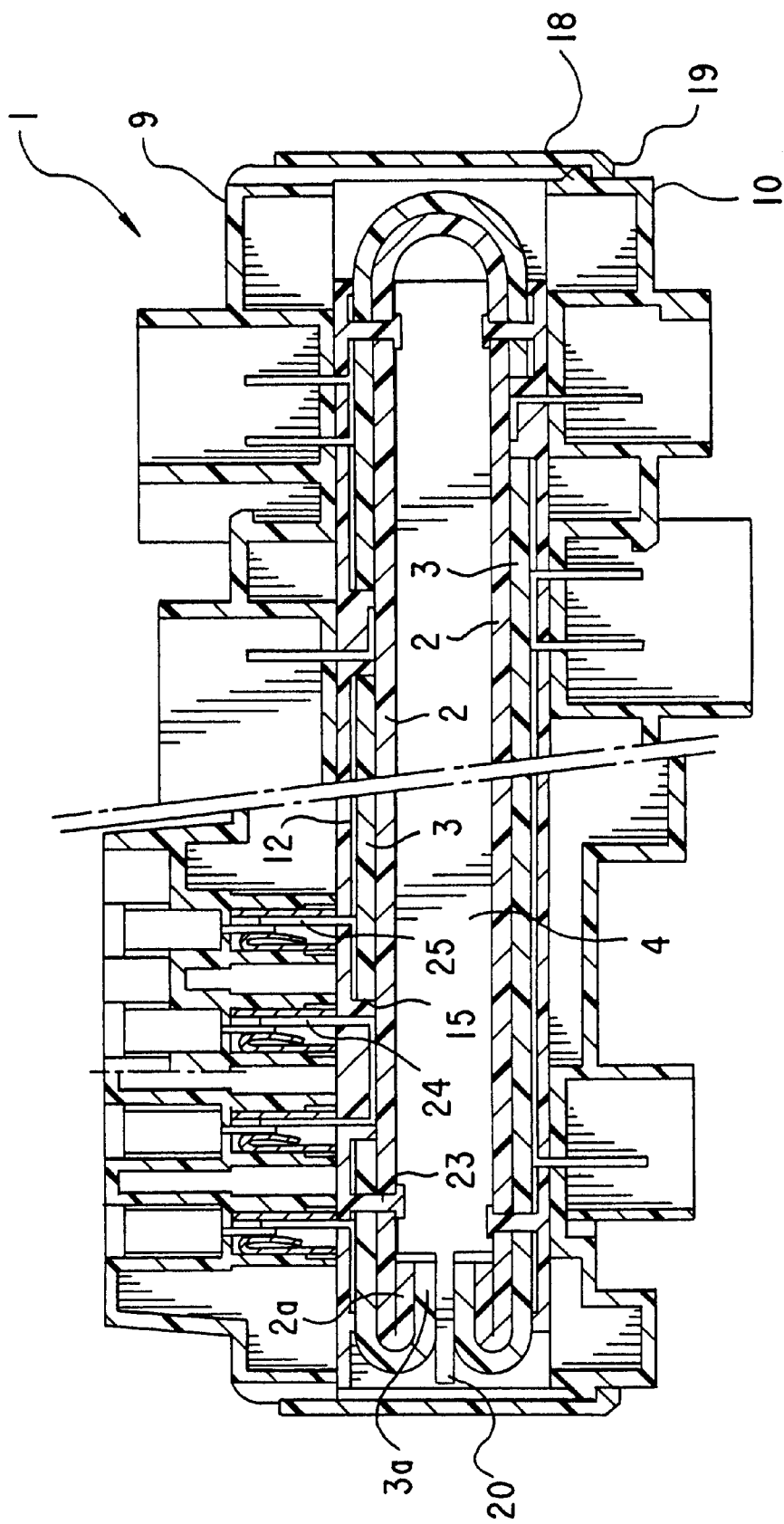
FIG. 6 is a longitudinal sectional view of an electric junction box according to this invention.

FIG. 6 shows a longitudinal cross sectional view of the above mentioned electric junction box 1. At one end of intermediate insulating board 4, the couple of wire-circuit sheets 2,3 are folded. While, on a thickness-reduced plate 20 formed at the other end, end parts 2a,3a of wire-circuit sheets 2,3 are further folded to be laminated. The couple of wire-circuit sheets 2,3 are combined to each other by pins 23. In the through openings 15 of outer wire-circuit sheet 3, a connection terminals (busbar terminals) 24 are provided to connect with the inner wire-circuit sheet 2. While, the outer wire-circuit sheet 3 connects directly with connection terminals (busbar terminals) 25.

Figure 7:
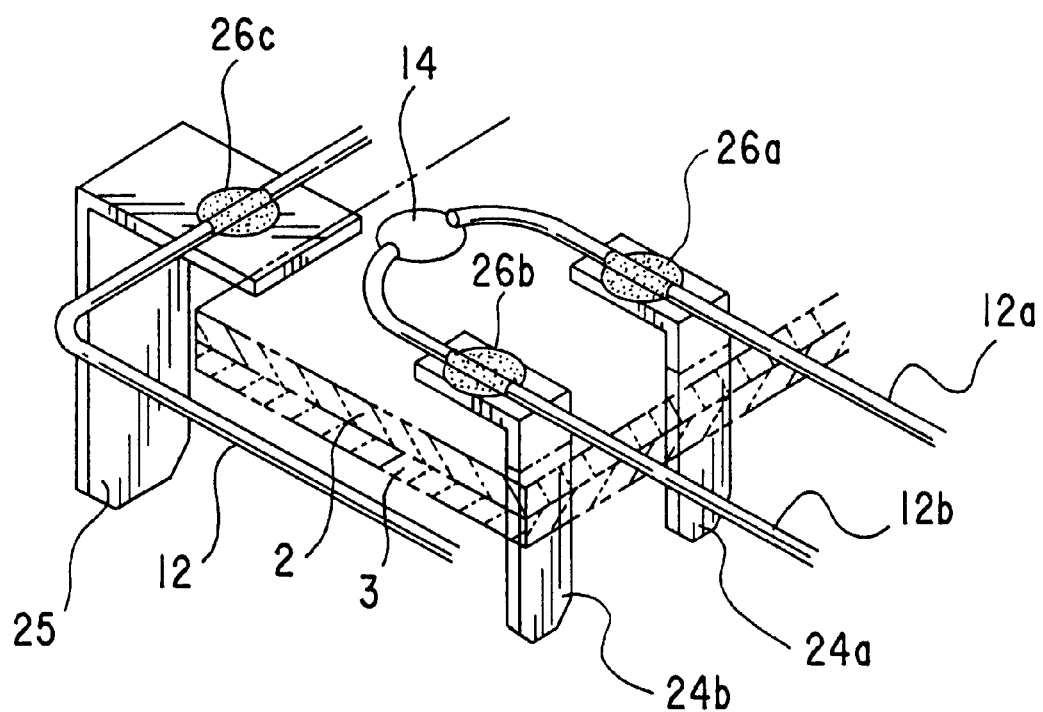
FIG. 7 is a perspective view showing an aspect of the connection in regard to connector terminals in FIG. 6.

FIG. 7 shows an aspect of the connection in respect to the connection terminals 24,25 which are completely connected to the wires 12 on the wire-circuit sheets 2,3 by heated depositions 25 due to soldering, beam welding or suchlike.

In this embodiment, open-wires are applied for the wire 12 and the open wires are caught and fixed between a couple of the resin sheets 11. When coated wires are utilized, only one resin sheet 11 is required to form an insulating wiring sheet, which reduces an assembly work. In this case, the couple of resin sheets 11 may be naturally utilized to have the advantage that the wires 12 do not come off easily and are reliably positioned.

As mentioned above, this embodiment provides the electric junction box with high density and compact circuits as the plurality of flexible wire-circuit sheets are laminated to compose the junction box. Besides, the wire-circuit sheets are produced in a process differed from a production line of the electric junction boxes, which achieves a simpler production line of the electric junction boxes and reduces the cost of equipment. Further, the equipment for wiring of wire-circuit sheets can be commonly used to increase productivity. Moreover, residual wire chips may not be undesirably included in the electric junction box.

FIG. 7 is also showing, as one embodiment, a method of connecting wires and busbar-tabs in regard to an electric junction box. When, for example, a busbar-tab 24a is connected to a wire 12a on the wire-circuit sheet 3, a wire part crossing the circuit cutting hole 14 is firstly formed as it is predetermined and then the busbar-tab 24a is brought into contact with the lower insulating sheet at the circuit connecting hole 26a. Then, a first welding horn (welding electrode), not shown, is put in contact with a part of the wire 12a crossing the circuit connecting hole 26a from the upper insulating sheet side and a second welding horn, not shown, is also placed in contact with the back of the busbar-tab 24a. In this condition, electricity is applied. This causes the part of the wire 12a crossing the circuit connecting hole 26a and the busbar-tab 24a to be connected. This method is similarly performed to connect a part of wire 12b crossing another circuit connecting hole 26b and a busbar-tab 24b and to connect a part of wire 12 crossing still another circuit connecting hole 26c and a busbar-tab 25.

After the wires 12a, 12b, 12 are connected to the busbar-tabs 24a, 24b, 25, the vertical portions of the busbar-tabs 24a, 24b, 25 are inserted into the tab insertion holes (not shown) in the lower cover 10 and fixed there. This enables the wire-circuit sheet 3 to be mounted on the upper cover 9 and the lower cover 10.

The similar process is performed in connecting a busbar-tab to a wire 12 in the wire-circuit sheet 2. This process involves mounting the wire-circuit sheet 2 on the wire-circuit sheet 3; putting the busbar-tab into contact with the lower insulating sheet at an area corresponding to the circuit connecting hole 13, which is crossed by the wire 12; putting a first welding horn not shown in contact with the part of the wire 12 crossing the circuit connecting hole 13, from the upper insulating sheet side of the wire-circuit sheet 2; putting a second welding horn not shown in contact with the back of the busbar-tab; and applying electricity. With these steps taken, the wire 12 crossing the circuit connecting hole 13 can be connected with the busbar-tab. This busbar-tab is inserted into a tab insertion hole in the lower cover 10, along with the busbar-tabs 24a, 24b, 25 connected to the wires 12a, 12b, 12 of the wire-circuit sheet 3.

Figure 8:
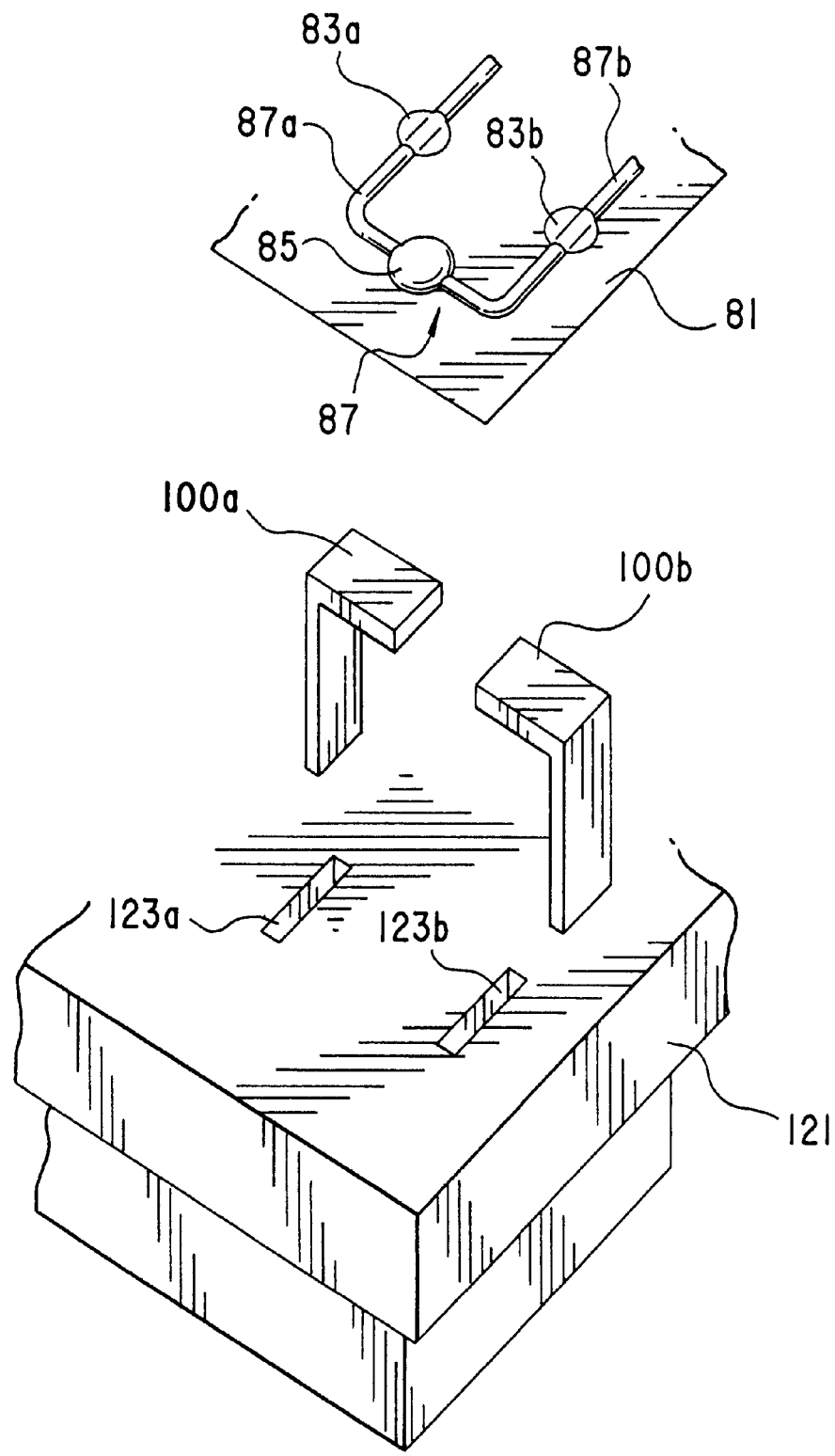
FIG. 8 is a perspective view showing busbar-tabs before being inserted and fixed in tab insertion holes in the cover of the electric junction box.
Figure 9:
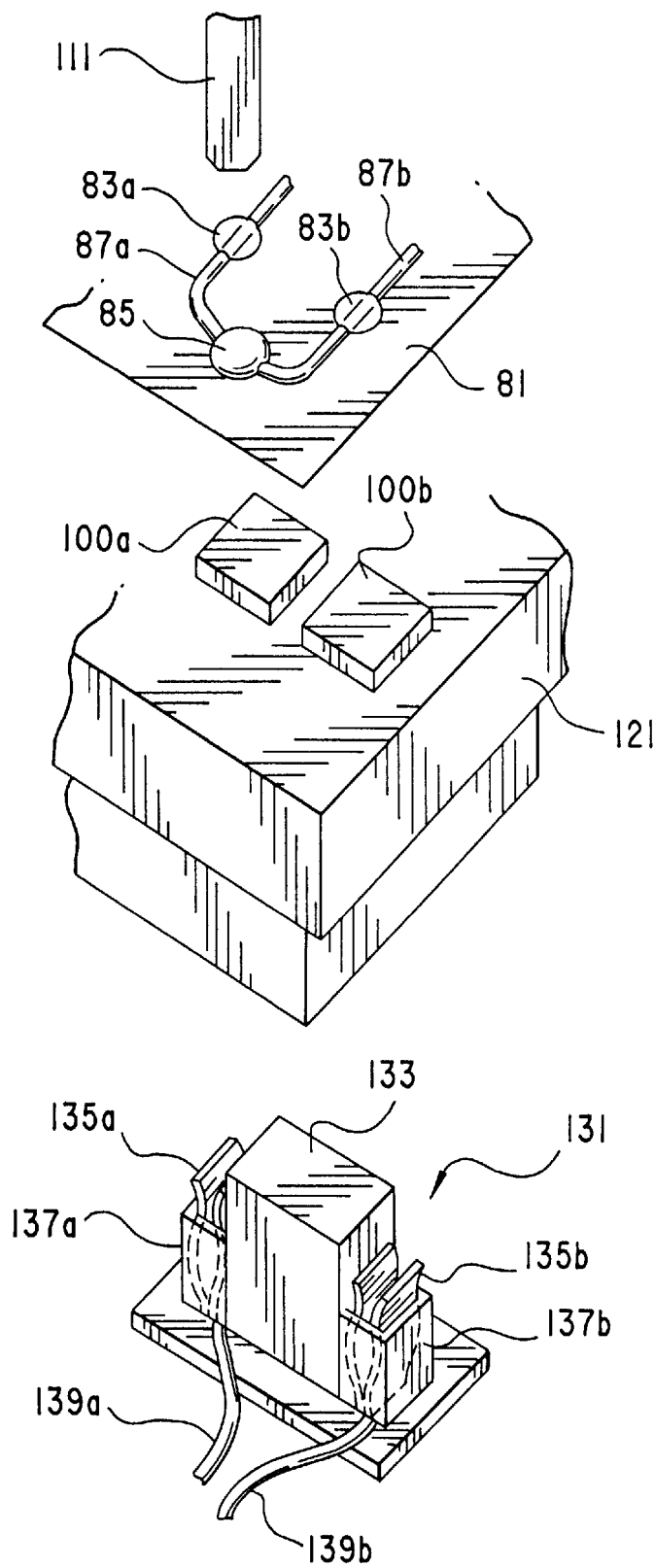
FIG. 9 is a perspective view showing the cover of the electric junction box attached with the busbar-tabs which is aligned with the wire-circuit sheet and jig.
Figure 10:
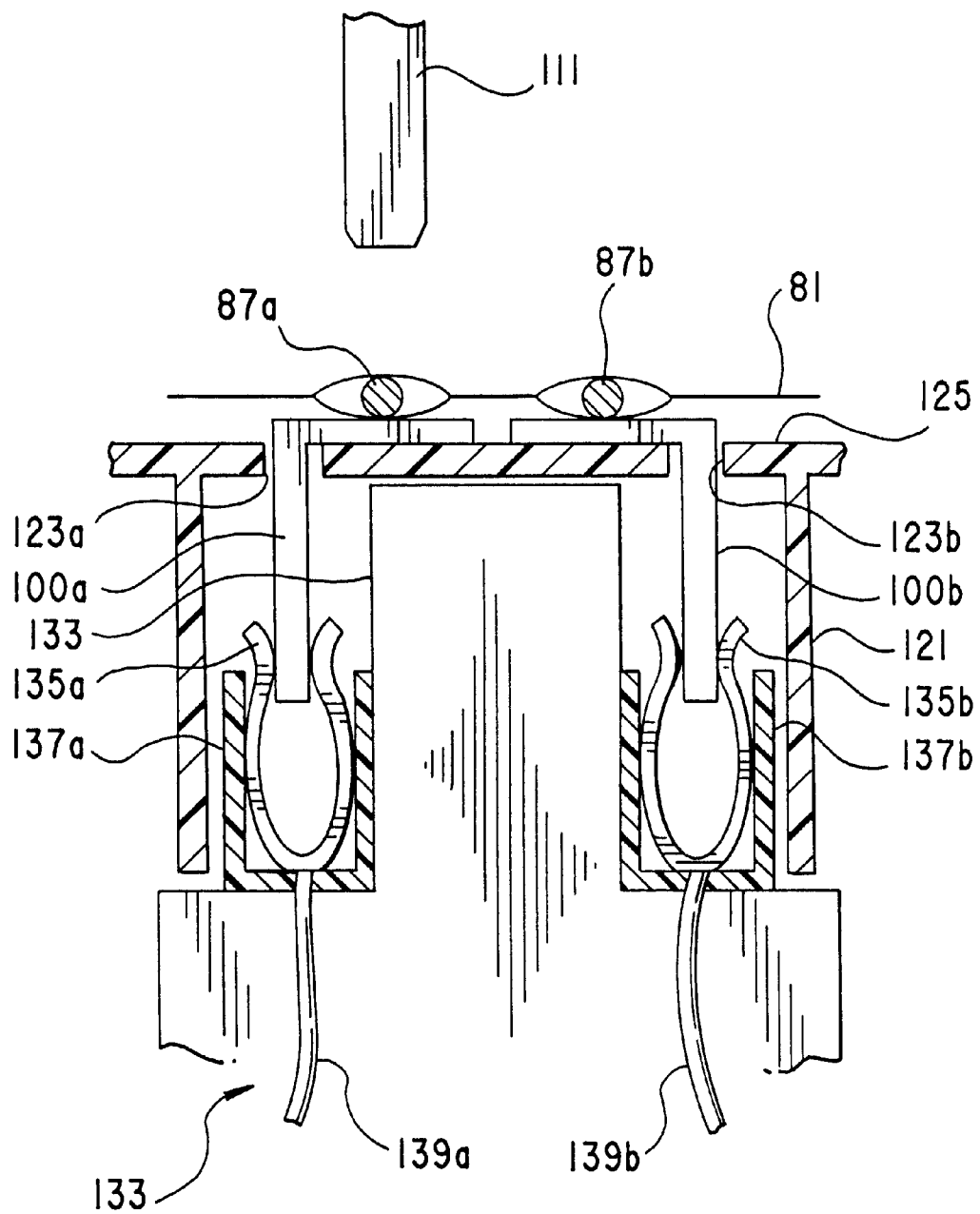
FIG. 10 is a partial side cross section showing the busbar-tabs connected to the wire of the wire-circuit sheet.

Next, by referring to FIGS. 8 to 10, another embodiment of the wire-busbar connecting method in regard to an electric junction box is explained. FIG. 8 is a perspective view showing the busbar-tabs before being inserted into the tab insertion holes in the cover of the electric junction box. FIG. 9 is a perspective view showing the cover of the electric junction box attached with the busbar-tabs which is aligned with the wire-circuit sheet and a jig. FIG. 10 is a partial side cross section showing the busbar-tabs connected to the wire of the wire-circuit sheet.

Firstly, as shown in FIG. 8, in a wire-circuit sheet 81, a wire 87 is laid to cross circuit connecting holes 83a, 83b and a circuit cutting hole 85. A part of the wire 87 crossing the circuit cutting hole 85 is cut to complete a wire-circuit sheet 81.

Secondly, busbar-tabs 100a, 100b are brought to tab insertion holes 123a, 123b in the cover 121 of the electric junction box. With the vertical portions of the busbar-tabs 100a, 100b inserted and fixed in the tab insertion holes 123a, 123b of the cover 121, the wire-circuit sheet 81 is placed on the cover 121 and a welding horn 111 is positioned directly above the circuit connecting hole 83a of the wire circuit sheet 81. At the same time, the jig 131 is located immediately below the position where the busbar-tabs 100a, 100b are inserted and fixed in the cover 121.

The jig 131, as shown in FIG. 10, has a retainer portion 133 that engages the back of a surface plate 125 of the cover 121 on which the busbar-tabs 100a, 100b are mounted. This retainer portion 133 supports the surface plate 125 when the welding horn 111 is pressed against the wires 87a, 87b through the circuit connecting holes 83a, 83b in the wire-circuit sheet 81 placed an the cover 121. The jig 131 has on both sides of the retainer portion 133 electrode portions 135a, 135b that fit over the vertical portions of the busbar-tabs 100a 100b inserted and fixed in the tab insertion holes 123a, 122b of the cover 121. The electrode portions 135a, 135b are each U-shaped in side view and elastically clamp the vertical portions of the busbar-tabs 100a, 100b. The electrode portions are protected around their circumference by protective plates 137a, 137b and are connected with wires 139a, 139b leading to a power supply not shown.

With the welding horn 111 positioned directly above the circuit connecting hole 83a of the wire-circuit sheet 81 mounted on the cover 121 and with the jig 131 situated immediately beneath the position where the busbar-tabs 100a, 100b are inserted and fixed in the cover 121, the retainer portion 133 is engaged with the back of the surface plate 125 where the busbar-tabs 100a, 100b are situated in the cover 121. At the same time, the electrode portions 135a, 135b of the jig 131 are fitted over the vertical portions of the busbar-tabs 100a, 100b inserted and fixed in the tab insertion holes 123a, 123b of the cover 121.

Next, the welding horn 111 is lowered to contact the wire 87a that crosses the circuit connecting hole 83a in the wire-circuit sheet 81 and current is applied to the welding horn 111 and the electrode portions 135a, 135b of the jig 131 to fix the wire 87a and the busbar-tab 100a together. With the wire 87a and the busbar-tab 100a welded together, the welding horn 111 is returned to the home position and at the same time the cover 121 of the electric junction box is shifted for the next welding of the busbar-tab 100b and the wire 87b crossing the circuit connecting hole 83b in the wire-circuit sheet 81. After the wires 87a, 87b and the busbar-tabs 100a, 100b are welded together, the welding horn 111 is again returned to its home position and the retainer portion 133 of the Jig 131 is parted from the back of the surface plate 125 of the cover 121. Then electrode portions 135a, 135b of the jig 131 are removed from the vertical portions of the busbar-tabs 100a, 100b.

Because this embodiment uses the jig 131 having the retainer portion 133 for supporting the back of the surface plate 125 of the cover 121 and the electrode portions 135a, 135b for applying electricity to the vertical portions of the busbar-tabs 100a, 100b secured to the cover 121, it is possible to securely position the busbar-tabs 100a, 100b by inserting them into the cover 121 of the electric junction box and to fixedly connect the wires 87a, 87b of the wire-circuit sheet 81 and the busbar-tabs 100a, 100b. This shortens the time taken to connect the wires 87a, 87b of the wire-circuit sheet 81 and the busbar-tabs 100a, 100b and also improves the workability, Further, this method obviates a jig that would otherwise be required for fixing the busbar-tabs when connecting the wires 87a, 87b and the busbar-tabs 100a, 100b. The process of transferring the busbar-tabs from the fixing jig also becomes unnecessary, reducing the facility cost and the number of processes.

Figure 11:
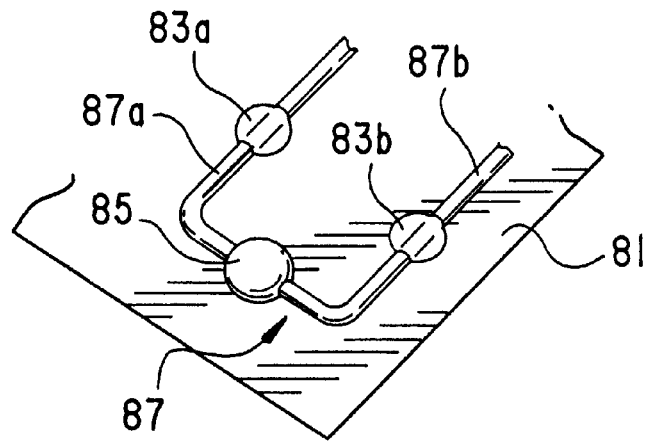
FIG. 11 is a perspective view showing a part of the completed wire-circuit sheet.
Figure 12:
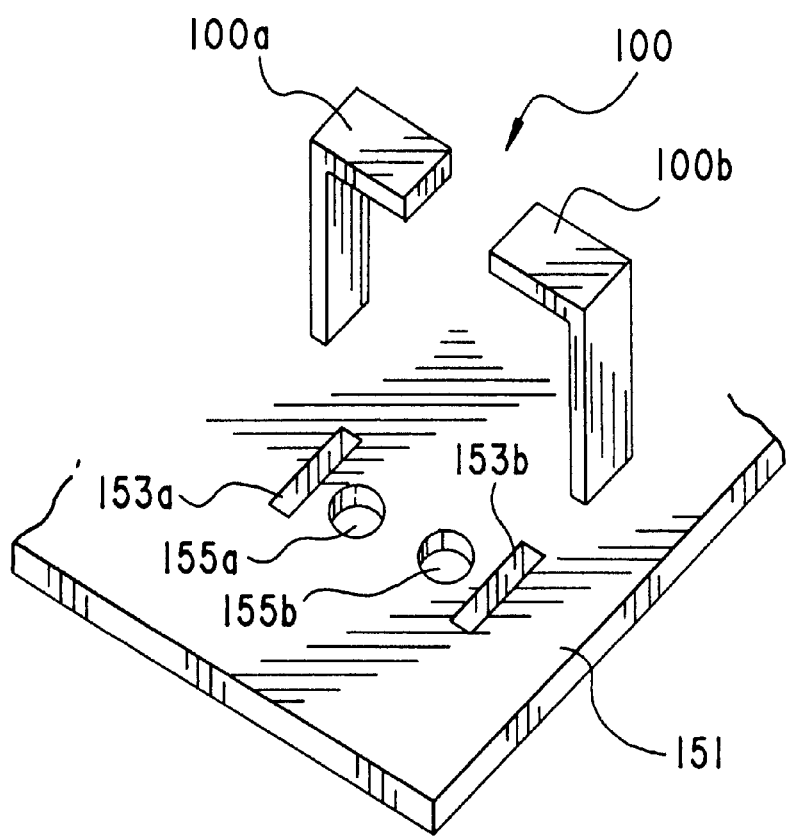
FIG. 12 is a perspective view showing busbar-tabs and a part of a busbar-tab positioning board.
Figure 13:
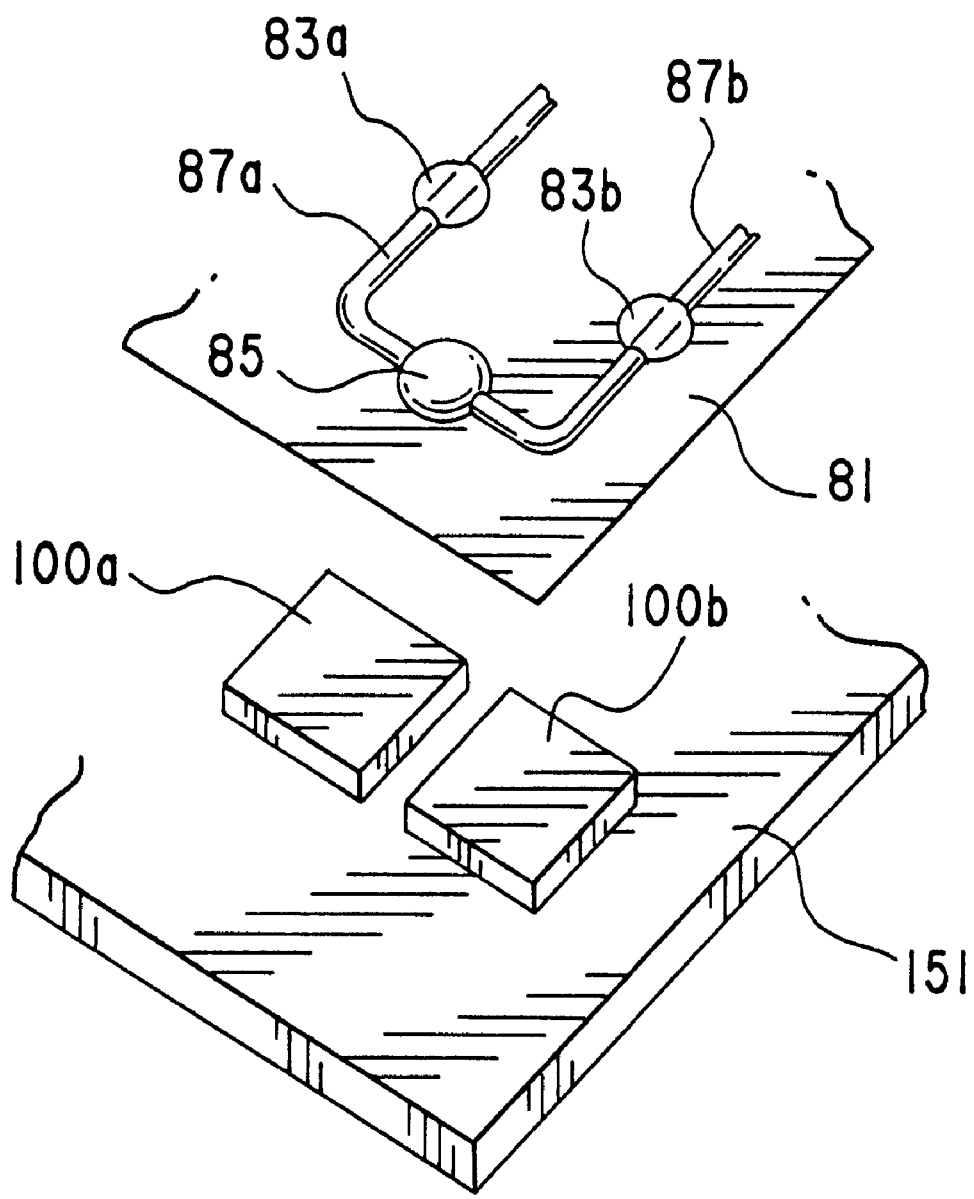
FIG. 13 is a perspective view showing a wire and the busbar-tabs before being connected.
Figure 14:
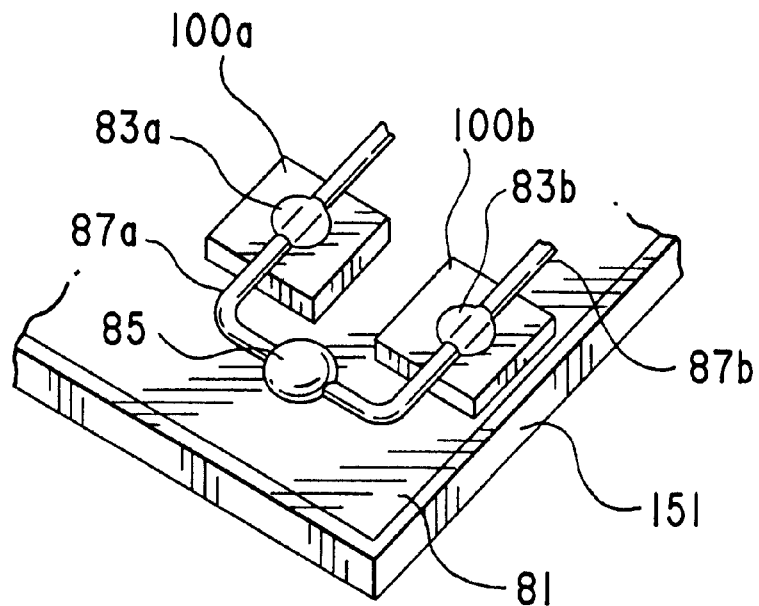
FIG. 14 is a perspective view showing the wire and the busbar-tabs aligned and connected.
Figure 15:
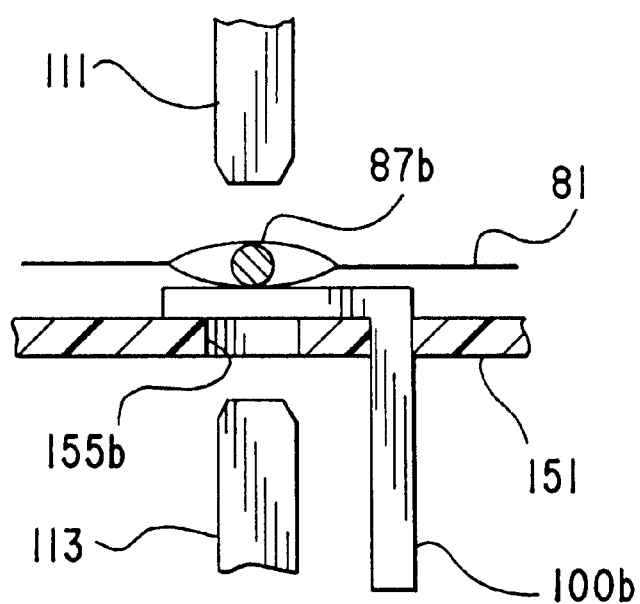
FIG. 15 is a partial side cross section showing the wire and the busbar-tab being connected by a welding horn.
Figure 16:
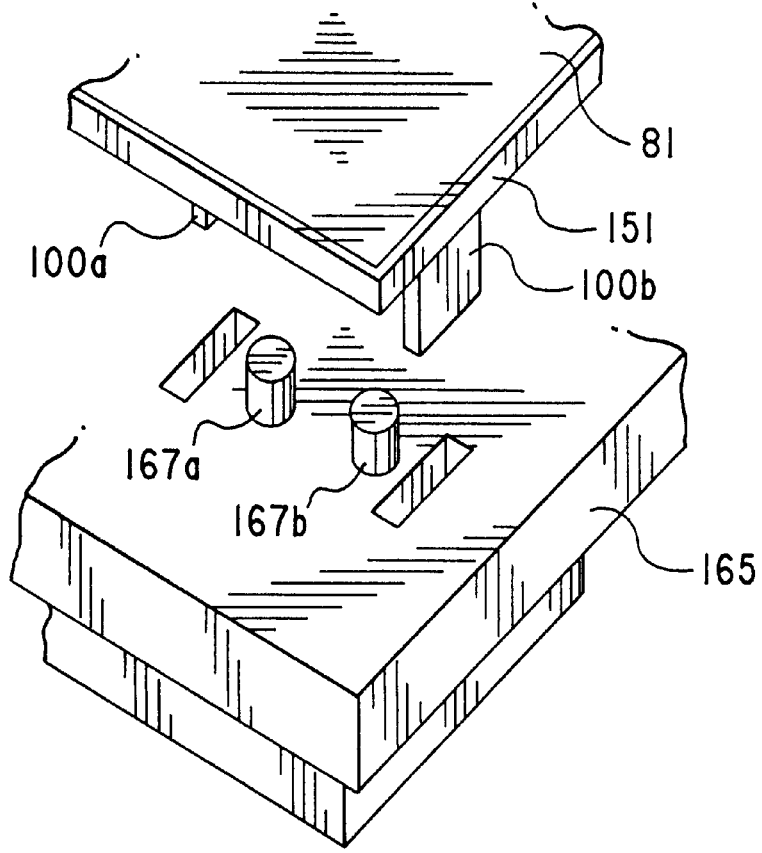
FIG. 16 is a perspective view showing the busbar-tab positioning board with their wire and busbar-tabs connected, and also the cover of the electric junction box.
Figure 17:
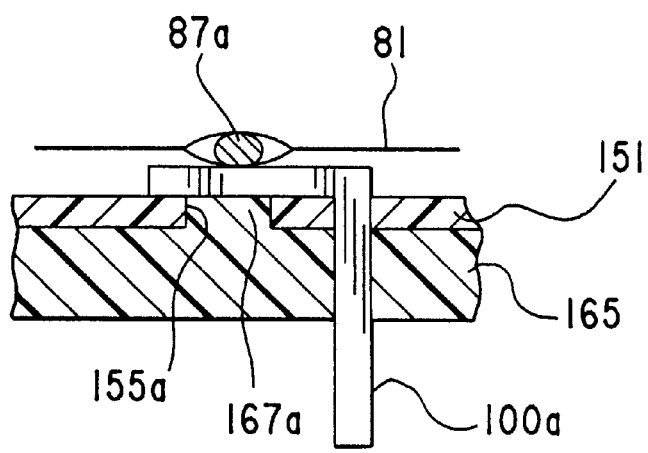
FIG. 17 is a partial side cross section showing the wire and the busbar-tab that, after having been connected together, are mounted on the cover of the electric junction box.

Next, by referring to FIGS. 11 to 17, a still another embodiment of the wire-busbar connection method is described. FIG. 11 is a perspective view showing a part of the completed wire-circuit sheet. FIG. 12 is a perspective view showing busbar-tabs and a part of a busbar-tab positioning board. FIG. 13 is a perspective view showing a wire and the busbar-tabs before being connected. FIG. 14 is a perspective view showing the wire and the busbar-tabs aligned and connected. FIG. 15 is a partial side cross section showing the wire and the busbar-tab being connected by a welding horn. FIG. 16 is a perspective view showing the busbar-tab positioning board with their wire and busbar-tabs connected, and also the cover of the electric junction box. FIG. 17 is a partial side cross section showing the wire and the busbar-tab that, after having been connected together, are mounted on the cover of the electric junction box.

Firstly, as shown in FIG. 11, the wire 87 is laid in the wire-circuit sheet 81 in such a way as to cross the circuit connecting holes 83a, 83b and the circuit cutting hole 85. A part of the wire 87 crossing the circuit cutting hole 85 is cut off to complete the wire-circuit sheet 81.

Secondly, as shown in FIG. 12, a busbar-tab positioning board 151 is formed. The busbar-tab positioning board 151 is made from an insulating thin plate, which, at predetermined positions corresponding to the positions where the tab insertion holes are formed in the cover of the electric junction box, is formed with busbar-tab fixing holes 153a, 153b into which the vertical portions of the busbar-tabs 100 are inserted and fixed at predetermined positions, The busbar-tab fixing hole 153a is a hole for the busbar-tab 100a that connects to that portion of the wire 87a which crosses the circuit connecting hole 83a of the wire-circuit sheet 81; and the busbar-tab fixing hole 153b is a hole for the busbar-tab 100b that connects to that portion of the wire 87b which crosses the circuit connecting hole 83b of the wire-circuit sheet 81.

Between the busbar-tab fixing holes 153a, 153b, the busbar-tab positioning board 151 has welding holes 155a, 155b formed therein to pass the first welding horn 111 described later, at positions corresponding to the position where the circuit connecting holes 83a, 83b are formed in the wire-circuit sheet 81.

The welding holes 155a, 155b, which are formed between the busbar-tab fixing holes 153a, 153b in this embodiment, have their positions determined according to the condition of laying the wires 87a, 87b and to the direction of busbar-tabs 100a, 100b inserted in the cover of the electric junction box and therefore can be arbitrary changed according to the design specification.

Then, as shown in FIG. 13, the vertical portions of the busbar-tabs 100a, 100b are inserted into the busbar-tab fixing holes 153a, 153b in the busbar-tab positioning board 151 so that they are fixed at predetermined positions. Then, as shown in FIG. 14, the wire-circuit sheet 81 is mounted on the busbar-tabs 100a, 100b which were positioned on the busbar-tab positioning board 151 in such a way that those portions of the wires 87a, 87b that cross the circuit connecting holes 83a, 83b of the wire-circuit sheet 81 are placed on the respective busbar-tabs 100a, 100b .

This is followed by the step shown in FIG. 15. The first welding horn 111 is lowered from the outside of the upper insulating sheet of the wire-circuit sheet 81 to contact the wire 87b crossing the circuit connecting hole 83b. The second welding horn 113 is raised into the welding hole 155b of the busbar-tab positioning board 151 at the back of the busbar-tab 100b until it contacts the busbar-tab 100b. Then, the first and second welding horns 111, 113 are energized to connect the wire 87b crossing the circuit connecting hole 83b and the busbar-tab 100b. After this, the first and second welding horns 111, 113 are returned to their home positions, This process is also performed to the wire 87a that crosses the circuit connecting hole 83a.

Then, as shown in FIG. 16, the wire-circuit sheet 81 and the busbar-tab positioning board 151 that are combined by connecting the wires 87a, 87b and the busbar-tabs 100a, 100b are mounted on the cover 165 of the electric junction box. On the surface of the cover 165 (where the busbar-tab positioning board 151 is mounted) at specified positions, i.e., at positions corresponding to the circuit connecting holes 83a, 83b of the wire-circuit sheet 81, are formed protrusions 167a, 167b that are inserted into the welding holes 155a, 155b in the busbar-tab positioning board 151. Thus, when the integrated wire-circuit sheet 81 and busbar-tab positioning board 151 are mounted on the cover 165 of the electric junction box, the protrusions 167a, 167b of the cover 165 fit into the welding holes 155a, 155b, thus preventing water from being collecting in and seeping through the welding holes 155a, 155b in the busbar-tab positioning board 151.

Because this embodiment employs the busbar-tab positioning board 151 for positioning the busbar-tabs 100a, 100b that connect to the wires 87a, 87b crossing the circuit connecting holes 83a, 83b in the wire-circuit sheet 81, when the busbar-tabs 100a, 100b connected to the wires 87a, 87b are inserted into the tab insertion holes in the cover 165, they can be prevented from being deviated and be securely inserted and fixed. Therefore, the time required for the insertion into the tab insertion hole in the cover 185 can be reduced, improving the workability.

Further, the busbar-tab positioning board 151 works as a jig during the welding process, thereby eliminating the need for dedicated jigs and preventing an increase in the facility cost.

Figure 18:
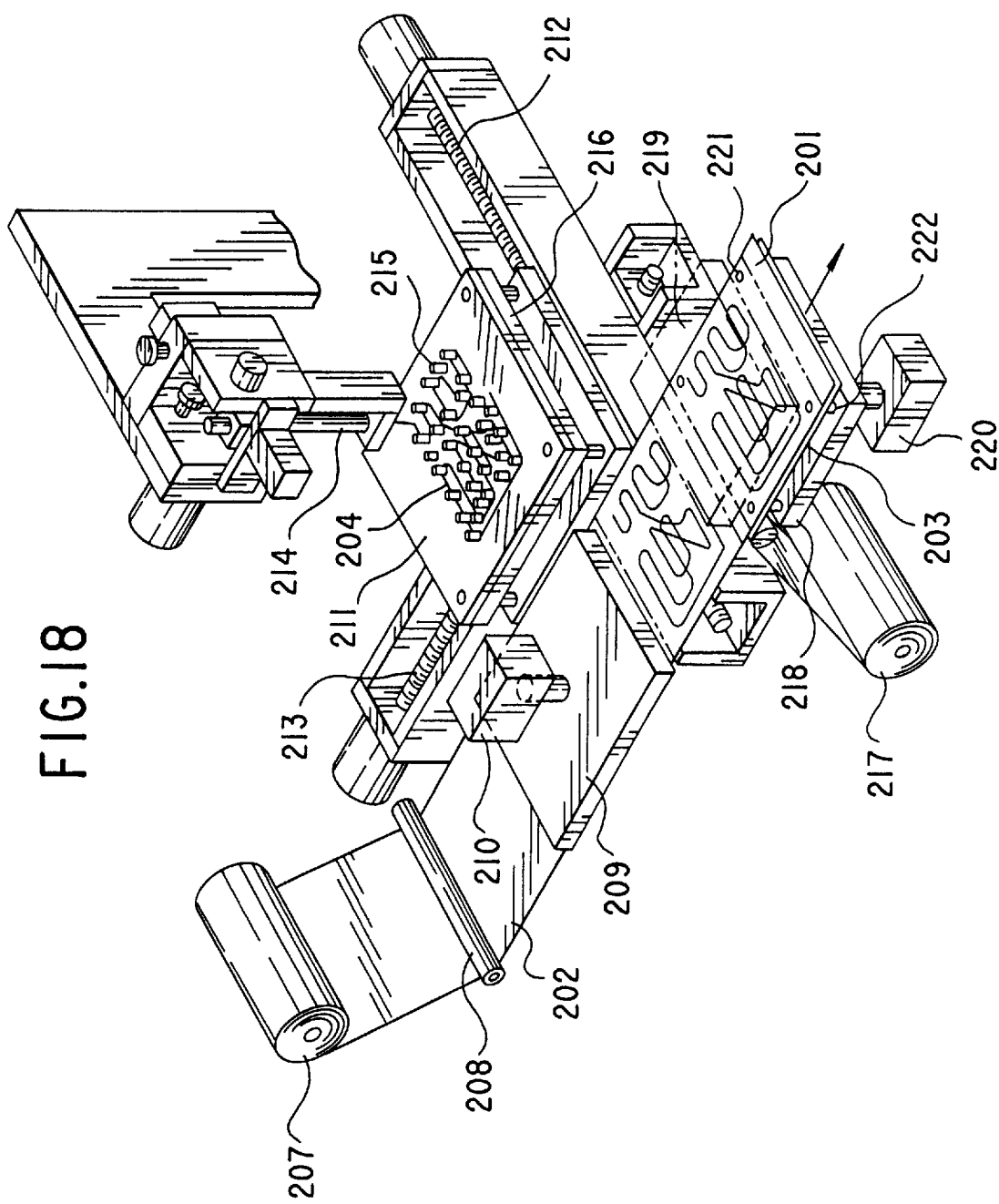
FIG. 18 is a perspective view of an embodiment of a manufacturing method in regard to a wire-circuit sheet according to this invention.

FIG. 18 shows an embodiment of a manufacturing method in regard to wire-circuit sheets according to this invention.

Figure 19:
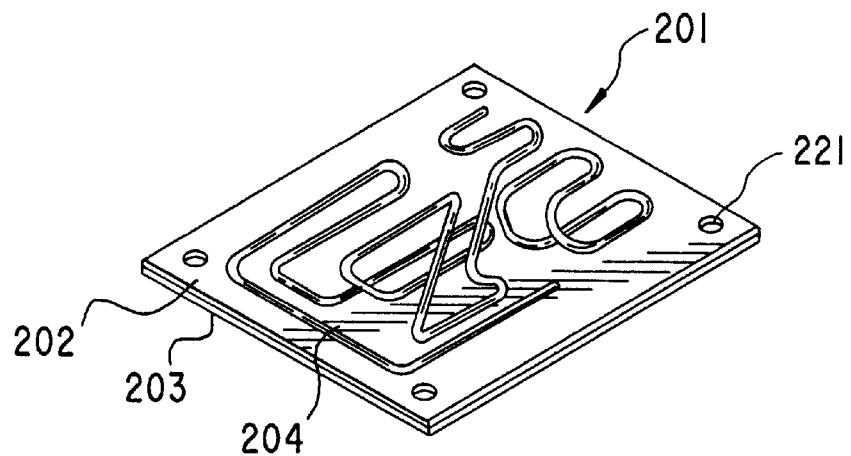
FIG. 19 is a perspective view of a wire-circuit sheet according to this invention.

The wire-circuit sheet 201, as shown in FIG. 19, is composed of a couple of upper and lower insulating resin sheets 202,203 in which coated wires 204 are fixed by bonding therebetween. The one side surfaces of the insulating resin sheets 202,203 are coated by a thermoplastic adhesive.

In FIG. 18, the upper insulating resin sheet 202 is fed from a rolled sheet 207, via a guiding roller 208, to come under a heating unit 209. The heating unit 209 is actuated vertically by an air cylinder 210. Below the upper insulating resin sheet 202 positioned under the heating unit 209, a conventional wire-laying board 211 is transferred by a laterally extending screw shaft 212. On the wire-laying board 211, the coated wires 204 are laid so as to complete a predetermined circuit. The wires 204 are laid by a wire handling arm head 214 as well as a conventional method, whereby the wire-laying board 211 is shifted bye screw shafts 212, 213 extending toward X or Y direction.

On the board 211 which is transferred under the upper insulating resin sheet 202, the heating unit 209 comes down by the air cylinder 210. The heating unit 209 presses and moves back-wiring pins on the board 211 with a base plate 216 so that the wire 204 is bonded on the lower surface of the upper resin sheet 202. That is, the heating unit 209 makes the upper resin sheet 202 soft and melts the thermoplastic adhesive so that the wire 204 can be bonded on the upper resin sheet 202 as maintaining-the wiring pattern arranged on the wire-laying board 211.

Then, at the stage a little proceeding along the sheet delivery line (in a direction shown by an arrow), a lower resin sheet 203 is provided from a sheet roll 217. On the upper surface of the lower resin sheet 203, the thermoplastic adhesive is coated also. A heating unit 218 similar to the aforementioned one is equipped as opposing to and positioned under the lower resin sheet 203. A pressing plate 219 is arranged, as opposing to the heating unit 218, above the upper resin sheet 202. The heating unit 218 lifted by the air cylinder 220 presses the lower resin sheet 203 to bond to the upper resin sheet 202. The resin sheet 202, 203 become soft by the heating unit 218 so as to make close contact with the wire 204, and the wire 204 is firmly bonded to fix between both of the resin sheet 202,203 without any deviation.

After the wire is bonded, both of the resin sheet 202, 203 are provided with positioning through-holes 221 situated at their four corners (which will be cut off when the resin sheet 202, 203 are completed). The positioning holes 221 are used, for example, for positioning to set the wire-circuit sheet in a conventional junction box housing. The positioning holes 221 are formed, for example, by punching pins 222 provided on the four corners of the heating unit 218 at the same time as the bonding of both of the resin sheets 202, 203. After bonded and punched to make the holes, the resin sheet 202; 203 are cut finally in a predetermined length to be completed as a wire-circuit sheet 201 such as shown in FIG. 19.

Figure 20:
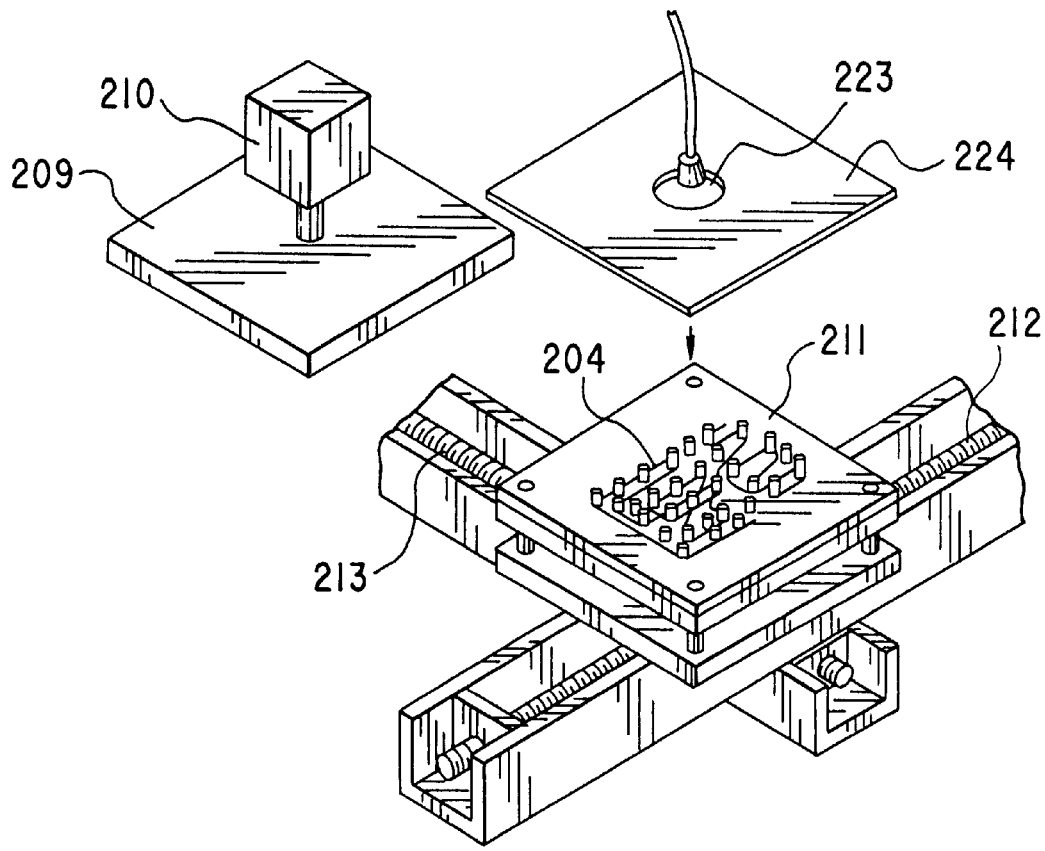
FIG. 20 is a perspective view showing a method for handling and supplying resin sheets by a handling arm pith a suction cap according to this invention.

While, as shown in FIG. 20, the resin sheet may be transferred, as a precut rectangular resin sheet 224, directly on the wire-laying board 211 by using a handling arm with a vacuum suction cap 223 instead of supplying by sheet rolls 207, 217. In this case, the upper resin sheet substrate 224 having the wire 204 bonded thereon by the heating unit 218 is stuck by the suction cap 223 and moved by the handling arm. A lower resin sheet substrate (not shown) is similarly set up on another heating unit (numeral 218 in FIG. 18) by using another suction cap assembly.

Figure 21A:
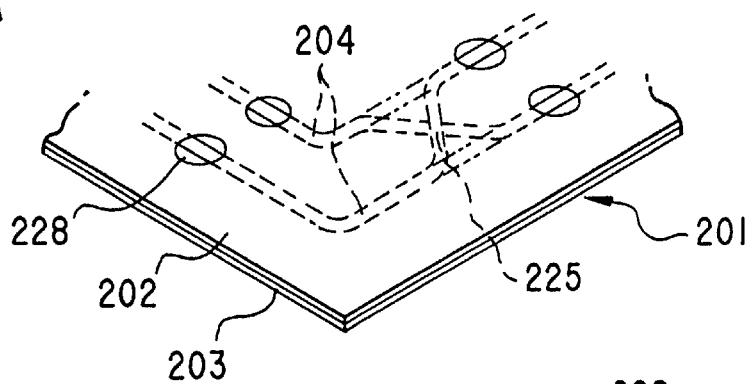
FIGS. 21A & 21B are perspective views showing a method for forming cutting holes at crossing parts of wires according to this invention.
Figure 21B:
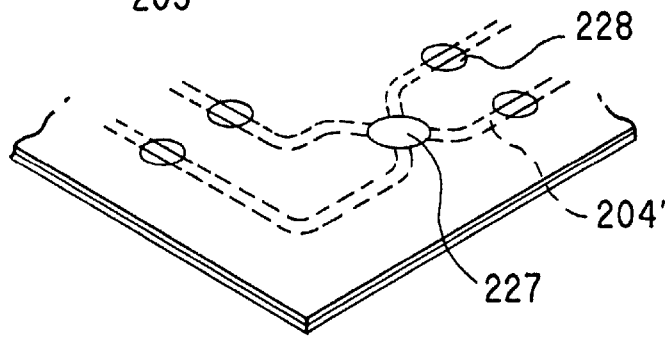
Figure 22A:
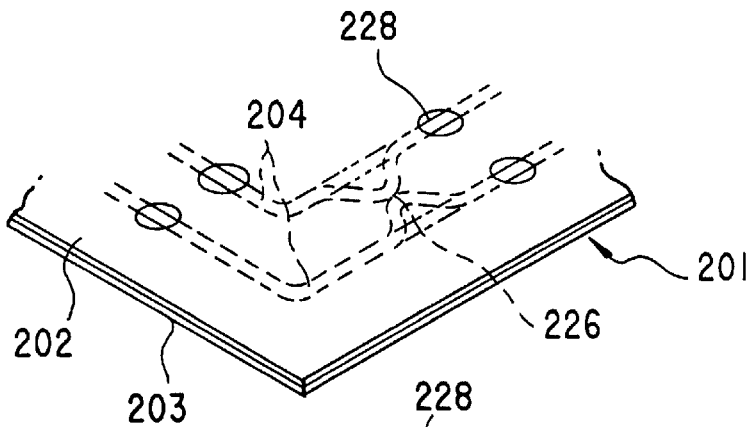
FIGS. 22A & 22B are perspective views showing a method for forming cutting holes at close parts of wires according to this invention.
Figure 22B:
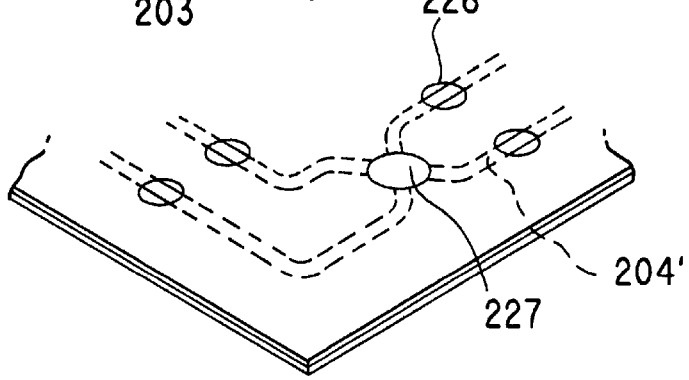
Figure 23:
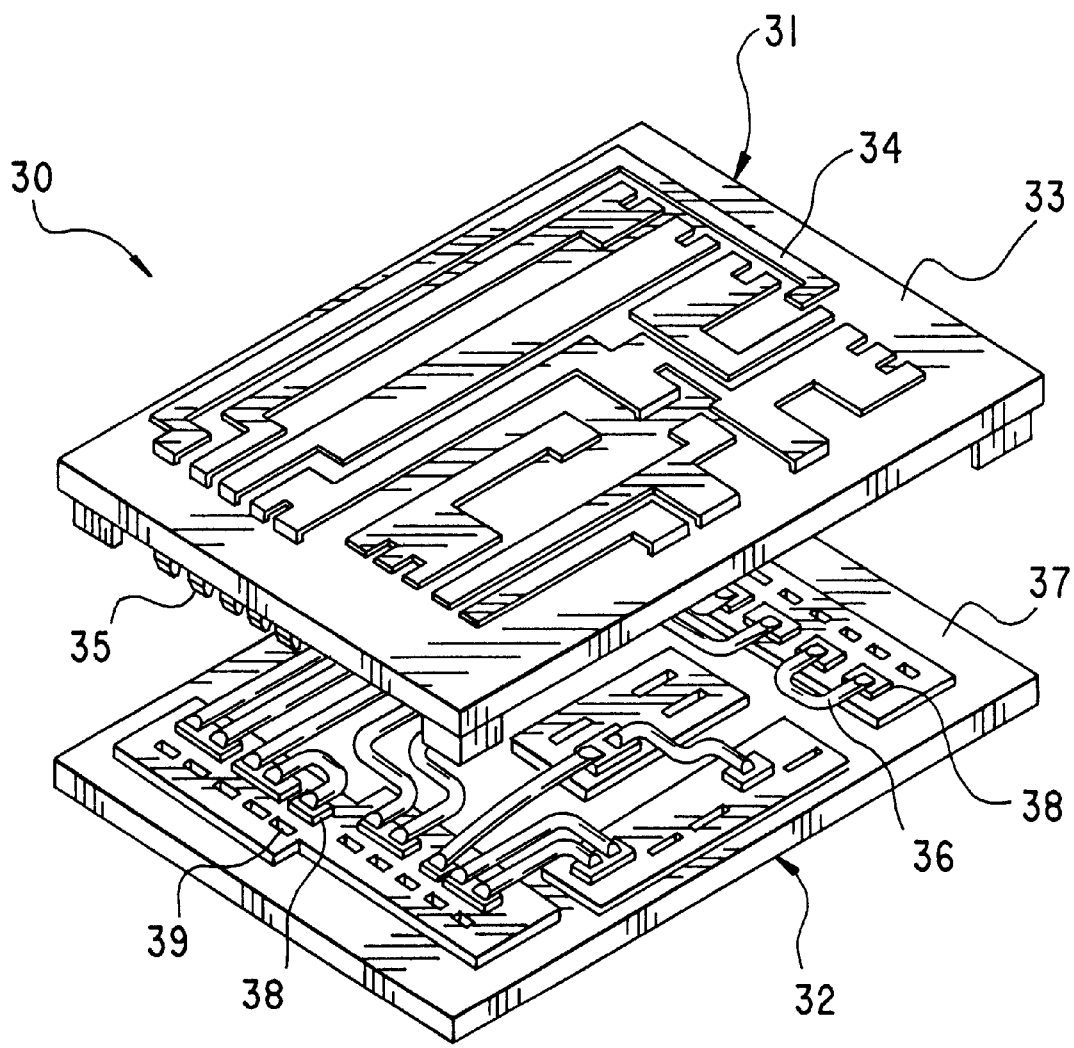
FIG. 23 is an exploded perspective view showing a conventional circuit board utilizing in an electric junction box.

Further, on the wire-circuit sheet 201, the wires 204, as shown in FIG. 21A, are crossed over each other or are, as shown in FIG. 22A, laid close to each other. The crossing parts 225 and close parts 226 of the wires 204, as shown in FIG. 21B or FIG. 22B, are cut off by wire cutting holes 227 so as to obtain separated wire circuits. While, on the resin sheets 202,203 circuit connecting holes 228 are provided in advance at connection parts with pressed contact terminals in an electric junction box, and the wires 204 are bonded on the sheets to be positioned just above the circuit connecting hole 228.

As the wire cutting holes 227 are provided at the crossing parts 225 and close parts 226 of the wires 204 so that a couple of wires can be cut off together at once, approximately one half of man-hours for punching holes are saved, and the number of the cutting holes are reduced so that wiring spaces for the wires 204 on the wire-circuit sheet 201 can be broader.

Thus, according to this invention, the wires are fixed between the couple of resin sheets as keeping the wiring pattern set up on the wire-laying base plate. Therefore, the wire-circuit sheet, for example, can be connected to pressed contact terminals, in an electric junction box in another production line so that a production line for multi-kinds of products, each of which is not so many, can be achieved in stead of a conventional one-pass production line with an expensive equipment cost. Besides the wire-circuit sheets are surely set in an electric junction box by the positioning holes of the wire-circuit sheets so that the wire can be positioned correctly for the pressed terminals of the electric junction box.

Further, as the wire cutting holes are formed in the manufacturing stage of wire-circuit sheets, cutting residuals of wires can not enter into the electrical junction box. And, as the wire cutting holes are provided at the crossing parts and close parts of the wires, it omits a conventional work of cutting wires by using an ordinal cutter and improves the productivity. That is, one half of man-hours for punching holes are saved in comparison with a work process that only one of the wires is cut at once, Therefore, the punching work to provide cutting holes becomes more effective and wiring spaces for the wires on the wiring sheet can be broader so that more wire circuits can be provided on the wiring sheet.

What is claimed is:

1. A method of manufacturing a wire-circuit sheet, comprising the steps of:

providing a pair of flexible resin sheets;

forming a circuit connecting hole through both of said resin sheets;

placing a wire on one of said resin sheets and across said circuit connecting hole on said one of said resin sheets;

overlaying the other of said resin sheets on the one of said resin sheets;

bonding said resin sheets to one another; and forming a wire cutting hole by simultaneously cutting said resin sheets and a wire disposed between said resin sheets.

2. The method of claim 1 further comprising the steps of:

placing a plurality of wires crossing each other between said resin sheets; and providing cutting holes at the crossing points of said plurality of wires to cut off said wires and said resin sheets together.

3. The method of claim 1 further comprising the steps of:

providing a plurality of wires lying close to each other between said resin sheets; and providing cutting holes at points where said plurality of wires come close to each other to cut off said wires and said resin sheets together.

4. A wire-circuit sheet manufacturing method comprising the steps of:

providing a pair of flexible resin sheets;

forming a circuit connection hole through both said resin sheets;

laying a wire across said circuit connection hole on one of said pair of resin sheets;

overlaying the other of said resin sheets on the one of said resin sheets to bond together; and forming a wire cutting hole through both said resin sheets to provide electrical discontinuity for a wire disposed between said resin sheets.

* * * * *